United States Patent
Wong et al.

(10) Patent No.: US 7,663,095 B2
(45) Date of Patent: Feb. 16, 2010

(54) PHOTODETECTOR WITH EMBEDDED INFRARED FILTER

(75) Inventors: Boon Yik Wong, Penang (MY); Kim Lye Lim, Penang (MY); Yong Keong Chin, Penang (MY); Kok Foo Leong, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/858,299

(22) Filed: Sep. 20, 2007

(65) Prior Publication Data

US 2009/0078859 A1    Mar. 26, 2009

(51) Int. Cl.
*H01J 5/02* (2006.01)
*H01J 5/16* (2006.01)

(52) U.S. Cl. .................. 250/239; 250/226
(58) Field of Classification Search ........... 250/226, 250/239, 208.1; 257/440, 431–434, 678; 348/272, 340; 356/402, 419; 438/57, 64
See application file for complete search history.

(56) References Cited

U.S. PATENT DOCUMENTS

| | | | |
|---|---|---|---|
| 4,827,118 A | * | 5/1989 | Shibata et al. ............... 257/432 |
| 5,283,691 A | * | 2/1994 | Ogasawara ................. 359/566 |
| 7,304,304 B2 | * | 12/2007 | Yamauchi et al. ........ 250/338.1 |
| 2003/0047790 A1 | * | 3/2003 | Rhodes et al. .............. 257/433 |
| 2004/0266051 A1 | * | 12/2004 | Kojima et al. ................. 438/57 |
| 2005/0258349 A1 | * | 11/2005 | Matsuyama et al. ......... 250/226 |
| 2006/0024505 A1 | * | 2/2006 | Keh et al. .................... 428/414 |
| 2006/0208182 A1 | * | 9/2006 | Tsukamoto et al. ......... 250/239 |
| 2007/0034784 A1 | * | 2/2007 | Tsai .......................... 250/226 |

FOREIGN PATENT DOCUMENTS

JP    58218176 A    * 12/1983

\* cited by examiner

*Primary Examiner*—Georgia Y Epps
*Assistant Examiner*—Jennifer Bennett

(57) ABSTRACT

A photodetector and method for making the same are disclosed. The photodetector includes a photodetector die mounted on a substrate, an infrared filter, and an encapsulating layer. The infrared filter is positioned over the photodetector, the infrared filter blocking light in an infrared region of the optical spectrum while allowing light in a visible region of the optical spectrum to reach the photodetector die. The encapsulating layer surrounds the photodetector and the substrate, the infrared filter being embedded in the encapsulating layer, which is transparent to light in the visible region.

11 Claims, 3 Drawing Sheets

PHOTODETECTOR WITH EMBEDDED INFRARED FILTER

BACKGROUND OF THE INVENTION

Illumination sources are required for many applications, including displays for a wide variety of computers and consumer devices such as TVs. Illumination sources based on fluorescent lights are particularly attractive because of their high light output per watt-hour of power consumed. However, such sources require high driving voltages, and this makes them less attractive for battery-operated devices.

As a result, there has been considerable interest in utilizing light sources based on LEDs in such applications. LEDs have better electrical efficiency than incandescent light sources and longer lifetimes than both incandescent and fluorescent light sources. In addition, the driving voltages needed are compatible with the battery power available on most portable devices. Finally, continued advancements in the efficiencies of LEDs hold the promise of providing a light source with significantly higher efficiencies than fluorescent light sources. Unfortunately, LEDs suffer from three drawbacks with respect to their spectral output.

One drawback is that LED emission in the visible part of the electromagnetic spectrum is relatively narrow, with typical FWHM of a few tens of nanometers. Therefore, an LED light source for generating an arbitrary color of light typically requires a plurality of LEDs. The relative intensities of the LEDs are adjusted by adjusting the average drive current through each of the LEDs. Feedback loops that depend on the measurement of the light output from each of the LEDs, or groups of LEDs, are typically utilized to adjust the average drive currents through the LEDs.

If each LEDs light output as a function of drive current remained constant over the life of the LED, the relative intensities of the LEDs could be set once at the factory. However, LEDs suffer from aging problems. As an LED ages, the average drive current through the LED must be increased to compensate for the aging of the LED. Since the aging effects are different for different color LEDs, the perceived color of the illumination source, and hence, the color of any associated display, will change over time, unless the drive currents are altered to compensate for the aging. In one class of light sources, the intensity of light in each of the color bands is measured by a corresponding photodetector. The drive conditions are then adjusted to maintain the output of the photodetectors at a set of predetermined values corresponding to the desired perceived color for the light source. This approach requires a design in which the photodetectors sample the light that is generated by the LEDs, and a feedback loop is provided between the photodetectors and the LEDs to compensate for the aging effects discussed above.

The light sensor used in the feedback loop typically includes one or more photodiodes. In some arrangements, one photodiode is used to measure each group of LEDs that emit light of a particular color. The output of the photodiode is used in a servo loop to adjust the average current through that group of LEDs. Unfortunately, the photodetectors in current use are sensitive not only to visible wavelengths, but also to infrared wavelengths, and hence, the output of the photodetector is not purely a function of the light of interest when infrared light is also present in the light received by the photodetector. The source of the infrared light can be the LEDs or ambient light sources that emit light that is also captured by the photodetectors. Hence, a feedback loop that operates on the signal from one of the photodetectors will not function properly unless the effects of the infrared can be eliminated. Since the amount of infrared reaching the photodetectors can vary over time, either the infrared reaching the photodetector must be measured and used to correct the feedback loop or some form of infrared filter must be incorporated in the feedback loop to block infrared from reaching the photodiodes in the photodetector.

In many applications, the infrared filter is incorporated into the package containing the photodetector. In the prior art, the filter is secured with adhesive to the top surface of the material encapsulating the die or dies of the photodetector package. Unfortunately, the thermal expansion coefficient of the filter material is typically very different from that of the underlying encapsulant. This mismatch leads to device failure when the package is subjected to large temperature cycles. For example, when the photodetector is mounted on a printed circuit board, or the like, using a solder reflow process.

SUMMARY OF THE INVENTION

The present invention includes a photodetector and method for making the same. The photodetector includes a photodetector die mounted on a substrate, an infrared filter, and an encapsulating layer. The infrared filter is positioned over the photodetector, the infrared filter blocking light in an infrared region of the optical spectrum while allowing light in a visible region of the optical spectrum to reach the photodetector die. The encapsulating layer surrounds the photodetector, and the substrate, the infrared filter being embedded in the encapsulating layer, which is transparent to light in the visible region. In one aspect of the invention, the substrate includes a lead frame, the photodetector being mounted on a portion of the lead frame and connected electrically to a plurality of leads in the lead frame. In another aspect of the invention, the infrared filter includes a layer of glass. In another aspect of the invention, the infrared filter includes a layer of material having a top surface, a bottom surface, and a plurality of side surfaces, and the top surface includes a surface of the photodetector through which light enters the photodetector. Alternatively, the infrared filter could be surrounded by the encapsulating layer.

The packaged photodetector can be constructed by providing a substrate having a plurality of dies mounted thereon, each die including a photodetector that generates a signal in response to light that is incident thereon, the photodetector being sensitive to light in the infrared portion of the optical spectrum and to light in the visible portion of the optical spectrum. The infrared filter is mounted with respect to each of the dies, the infrared filter being positioned such that light entering the packaged photodetector passes through the infrared filter before reaching one of the dies. The photodetectors and the substrate are then encapsulated in a layer of material that is transparent to light in the visible region, the infrared filter being embedded in the encapsulating layer. The substrate and the layer of material are then divided to provide a plurality of the packaged photodetectors. In one aspect of the invention, one filter for each die is placed on a surface of a mold used to mold the layer of material. Alternatively, one filter could be placed directly adjacent to each die prior to encapsulating the photodetectors or a single layer of infrared absorbing material could be placed over all of the dies, the layer being divided when the substrate is divided.

DETAILED DESCRIPTION OF THE PREFERRED EMBODIMENTS OF THE INVENTION

Figure 1:
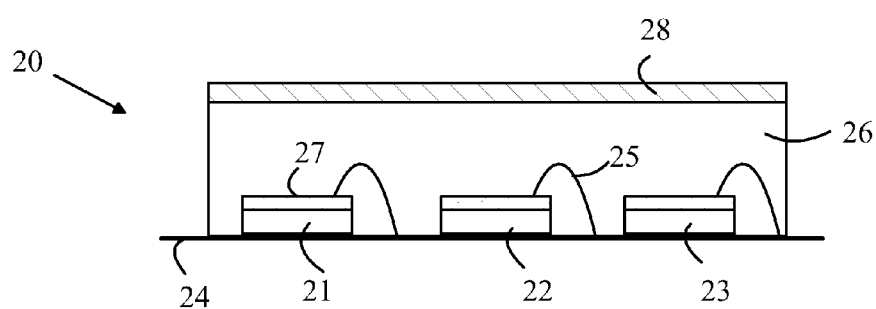
FIG. 1 is a cross-sectional view of a prior art photodetector that includes an infrared filter.

The manner in which the present invention provides its advantages can be more easily understood with reference to FIG. 1, which is a cross-sectional view of a prior art photodetector that includes an infrared filter. Photodetector 20 includes a plurality of dies shown at 21-23. Each of the dies includes one or more photodiodes. The dies are mounted on a lead frame 24 and connected to the lead frame leads by one or more wire bonds such as wire bond 25 or by connections on the bottom of the dies. The dies are encapsulated in a transparent layer 26 of insulating material that protects the dies from moisture and other environmental hazards. The dies are covered by dye filters 27 to limit each photodiode to light in a predetermined band of wavelengths. Unfortunately the material used for the die filters is transparent in the infrared. Hence, a separate infrared filter 28 is typically bonded to the top surface of layer 26 to prevent infrared light from reaching the photodiodes.

The infrared filter is typically constructed from glass, and hence, has a significantly different thermal coefficient of expansion than layer 26 which is typically a polymeric material such as epoxy or silicone. The difference in thermal coefficients of expansion can lead to delamination of the infrared filter, and hence, early device failure.

Figure 2:
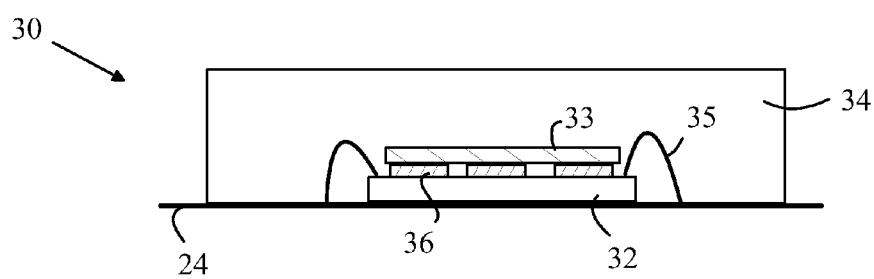
FIG. 2 is a cross-sectional view of one embodiment of a photodetector according to the present invention.

Refer now to FIG. 2, which is a cross-sectional view of one embodiment of a photodetector according to the present invention. Photodetector 30 includes a die 32 having a plurality of photodiodes. Each photodiode is covered by a bandpass filter layer such as layer 36. An infrared filter 33 is placed directly on the dye layers prior to the encapsulation of the die in layer 34. In one embodiment, the encapsulating material is chosen to have sufficient flexibility to accommodate any difference in thermal coefficient of expansion between the material of filter 33 and the encapsulating material. For example, a silicone-based material can be utilized. In one such embodiment, the thermal coefficient of expansion of the filter is chosen to be greater than that of the encapsulating material, and the device is encapsulated at a temperature below that of the anticipated operating temperature of the photodetector. In this case, filter 33 expands, and the increased dimension is accommodated by layer 34. However, even if the bond between filter 33 and encapsulating layer 34 fails, filter 33 remains trapped in position over die 32, and hence, continues to block infrared radiation from reaching the photodetectors on die 32.

While the embodiment of the present invention shown in FIG. 2 provides an improvement over the prior art, the infrared filters must be individually placed over the dies and attached with an adhesive that is sufficient to immobilize the filters during the encapsulation process. Chip picking equipment commonly used in packaging production lines can be utilized for this function; however, the additional operations increase the assembly time and cost. In addition, the infrared filter must also be sized with respect to the die such that the filter does not interfere with wire bonds 35 and still cover the photodiodes.

Figure 3:
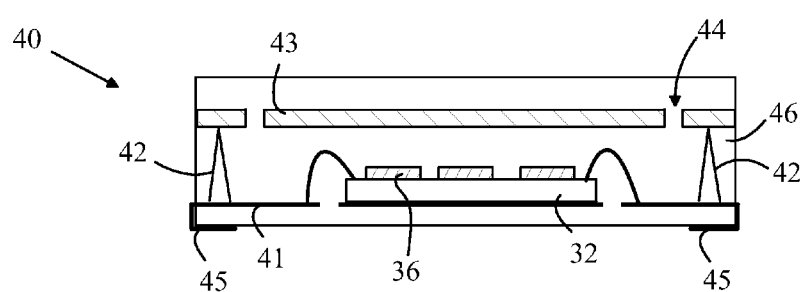
FIG. 3 is a cross-sectional view of another embodiment of a photodetector according to the present invention.

Refer now to FIG. 3, which is a cross-sectional view of another embodiment of a photodetector according to the present invention. Photodetector 40 includes a die 32 having a plurality of photodiodes. One or more of the photodiodes is covered by a filter layer such as layer 36 to limit the visible light response of that photodiode to a predetermined band of wavelengths. In addition, all of the photodiodes are covered by an infrared filter 43 that is transparent in optical bands in which the photodiodes are sensitive. Die 32 is mounted on a lead frame 41 having external leads 45 that are bent around encapsulating layer 46 to provide surface mounts for connection to corresponding pads on a printed circuit board or the like. Infrared filter 43 is positioned above die 32 by spacers 42 and includes openings 44 used to allow the encapsulating material to flow through infrared filter 43 during the molding operations used to create layer 46.

Figure 4:
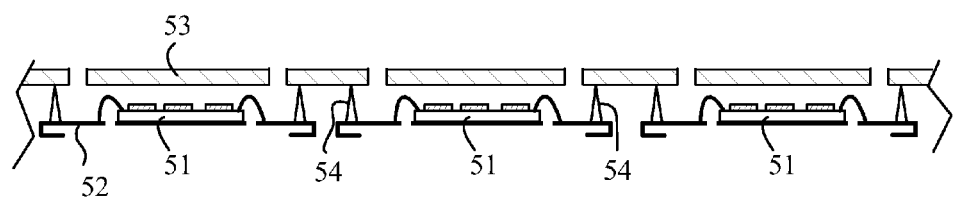
FIG. 4 illustrates the dies mounted on pads on a two-dimensional lead frame that will eventually be divided into individual photodetectors.
Figure 5:
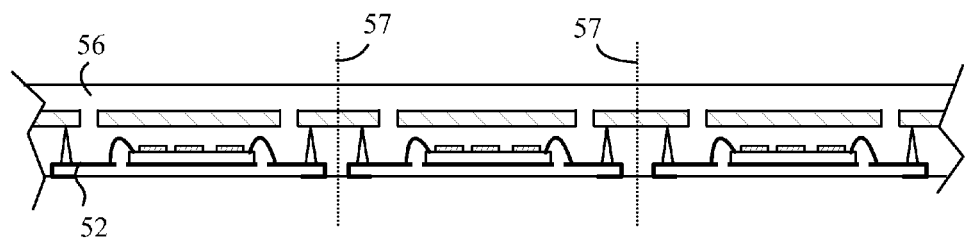
FIG. 5 illustrates the lead frame encapsulated by molding a layer of transparent material over and around the lead frame.

Refer now to FIGS. 4 and 5, which are cross-sectional views of the construction of a plurality of photodetectors such as photodetector 40 discussed above. Referring to FIG. 4, the dies shown at 51 are mounted on pads on a two-dimensional lead frame 52 that will eventually be divided into individual photodetectors. The lead frame is plated with silver and connected to the lead frame by 1.2 mil gold wires in one embodiment of the present invention. A sheet 53 of infrared filter material is placed over all of the dies on lead frame 52. The sheet can be adhesively attached to the spacers or held in place by some other mechanism. While the example shown in FIG. 4 has a plurality of spacers 54 in each photodetector, arrangements in which fewer spacers are utilized can also be utilized. The number of spacers depends on the rigidity of sheet 53 and the forces that sheet 53 must endure during the encapsulation process.

After sheet 53 is positioned and secured with respect to lead frame 52, the lead frame is encapsulated by molding a layer of transparent material 56 over and around lead frame 52 as shown in FIG. 5. In one embodiment, the lead frame is encapsulated in an epoxy such as Ablebond 84-1LMISR4. Finally, the individual photodetectors are singulated by cutting the molded sheet along the lines shown at 57. It will be appreciated that the fabrication process has essentially the same level of difficulty as that used to package conventional photodetectors.

In the embodiment shown in FIG. 3, the infrared filter is buried some distance from the top surface of the packaged part. The amount of material that must cover the infrared filter to provide sufficient bonding to assure that temperature fluctuations do not lead to package failure will, in general, depend on the degree of thermal coefficient of expansion mismatch between the infrared filter material and the encapsulating material, as well as the degree to which the encapsulating layer can accommodate expansion or contraction of the infrared filter. In some cases, the mismatch may be sufficiently small to allow the top surface of the infrared filter to be coincident with the top surface of the package.

Figure 6:
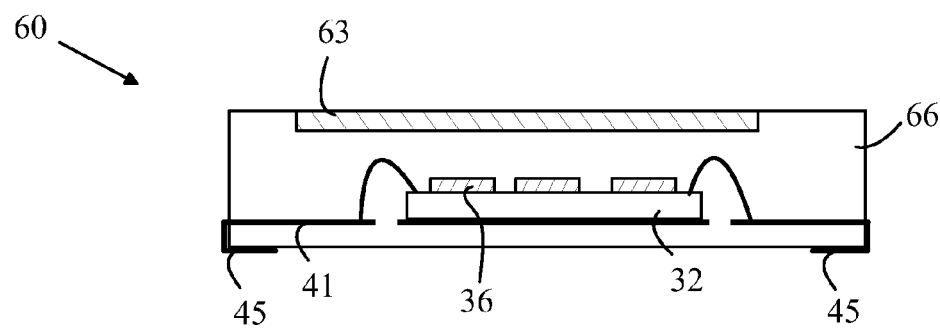
FIG. 6 is a cross-sectional view of another embodiment of a photodetector according to the present invention.

Refer now to FIG. 6, which is a cross-sectional view of another embodiment of a photodetector according to the present invention. Photodetector 60 includes an infrared filter 63 that is molded into the top surface of encapsulating layer 66. The filter is a planar layer of material having a top surface and a plurality of side surfaces. The bottom surface and side surfaces are in contact with the molding compound. Infrared filter 63 can be incorporated in the top surface by attaching the filter to the inside top surface of the mold prior to injecting the encapsulating compound. This embodiment is well suited for use with molding compounds that are sensitive to moisture and package arrangements that are designed to be surface mounted, and hence, subjected to significant heat cycling. Photodetectors made with such molding compounds tend to show a "pop-corn" defect when heated during solder reflow if moisture has been absorbed by the compounds. In photodetector 60, infrared filter 63 is constructed from a moisture resistant material such as glass, and hence, the top surface is protected from moisture absorption, and, hence, such defects are substantially reduced. In addition, the glass surface is more resistant to scratching.

The above-described embodiments of the present invention utilize photodiodes as the light photodetector. However, other forms of light detectors such as phototransistors could also be utilized.

Various modifications to the present invention will become apparent to those skilled in the art from the foregoing description and accompanying drawings. Accordingly, the present invention is to be limited solely by the scope of the following claims.

What is claimed is:

1. A photodetector comprising:
a photodetector die mounted on a substrate;
an infrared filter positioned over and spaced away a distance from said photodetector die, said infrared filter blocking light in an infrared region of the optical spectrum while allowing light in a visible region of the optical spectrum to reach said photodetector die, said infrared filter comprising a layer of material having a light-receiving top surface and a bottom surface opposite said top surface and facing said photodetector die;
an encapsulating layer surrounding said photodetector die and said substrate, said infrared filter being completely embedded in said encapsulating layer, said encapsulating layer being transparent to light in said visible region and to light in said infrared region, all of said top surface and all of said bottom surface of said infrared filter are in contact with and surrounded by said encapsulating layer, and at least a portion of said encapsulating layer is between said photodetector die and said infrared filters;
at least one spacer positioned between said substrate and said infrared filter to provide said distance between said infrared filter and said photodetector die; and
at least one opening in said infrared filter to allow said at least a portion of said encapsulating layer to flow therethrough to said photodetector die during molding of said photodetector.

2. The photodetector of claim 1 wherein said photodetector die comprises a plurality of photodiodes.

3. The photodetector of claim 1 wherein said photodetector die comprises a plurality of phototransistors.

4. The photodetector of claim 2 wherein at least one of said photodiodes includes a bandpass filter layer that blocks light in said visible region that is outside a predetermined band of wavelengths in said visible region.

5. The photodetector of claim 1 wherein said substrate comprises a lead frame, said photodetector being mounted on a portion of said lead frame and connected electrically to a plurality of leads in said lead frame.

6. The photodetector of claim 1 wherein said infrared filter comprises glass.

7. The photodetector of claim 1 wherein said encapsulating layer comprises epoxy or silicone.

8. A method for fabricating a packaged photodetector comprising:
providing a substrate having a plurality of dies mounted thereon, each die comprising a photodetector that generates a signal in response to light being incident thereon, said photodetector being sensitive to light in the infrared portion of the optical spectrum and to light in the visible portion of the optical spectrum;
positioning at least one spacer on said substrate;
mounting an infrared filter with respect to each of said dies, said infrared filter having a light-receiving top surface and a bottom surface opposite said top surface, in contact with said at least one spacer, and facing said dies, said infrared filter being positioned such that light entering said packaged photodetector passes first through said top surface and then through said bottom surface of said infrared filter before reaching one of said dies, wherein said infrared filter comprises at least one opening;
encapsulating said dies, said substrate, and said infrared filter in a layer of material that is transparent to light in said visible region and to light in said infrared region, said infrared filter being spaced away from said dies and completely embedded in said encapsulating layer such that all of said top surface and all of said bottom surface of said infrared filter are in contact with and surrounded by said encapsulating layer, allowing at least a portion of said encapsulating layer to flow through said at least one opening in said infrared filter such that said at least a portion of said encapsulating layer is between said dies and said infrared filter; and
dividing said substrate and said layer of material to provide a plurality of said packaged photodetectors.

9. The method of claim 8 wherein mounting said infrared filter comprises placing a layer of filter materials over all of said dies, said layer being divided when said substrate is divided.

10. The method of claim 8 wherein said filter comprises a layer of glass.

11. The method of claim 8 wherein said substrate comprises a lead frame.

* * * * *